United States Patent [19]

Miller et al.

[11] Patent Number: 4,501,974
[45] Date of Patent: Feb. 26, 1985

[54] PULSE STRETCHING AND LEVEL SHIFTING CIRCUIT

[75] Inventors: Ira Miller, Tempe; Michael W. Null; Robert N. Dotson, both of Mesa, all of Ariz.

[73] Assignee: Motorola, Inc., Schaumburg, Ill.

[21] Appl. No.: 449,035

[22] Filed: Dec. 13, 1982

[51] Int. Cl.³ .................... H03K 17/56; H03K 3/017
[52] U.S. Cl. ................................. 307/246; 307/267; 307/228; 307/362
[58] Field of Search ............... 307/267, 246, 228, 594, 307/362; 328/58

[56] References Cited

U.S. PATENT DOCUMENTS

| | | | |
|---|---|---|---|
| 3,378,701 | 4/1968 | Frank | 307/246 |
| 3,638,045 | 1/1972 | Hughes | 307/267 |
| 3,712,990 | 1/1973 | Gordon | 307/267 |

Primary Examiner—Stanley D. Miller
Assistant Examiner—B. P. Davis
Attorney, Agent, or Firm—Vincent B. Ingrassia

[57] ABSTRACT

A pulse stretching integrated circuit includes an on-chip capacitor. A first transistor means including an input transistor and an emitter follower transistor supplies a charging current to the capacitor so as to charge it to a first voltage when an input signal pulse is in a first logical state. A differential transistor pair has a first input coupled to the emitter follower transistor and to the capacitor and has a second input coupled to a reference voltage for generating a first output when the capacitor voltage is less than the reference voltage and for generating a second output when the capacitive voltage is greater than the reference voltage. An additional transistor is coupled to the capacitor for discharging the capacitor when the input signal pulse is in a second logical state causing the voltage at the first input of the differential pair to fall below the reference voltage.

4 Claims, 4 Drawing Figures

PULSE STRETCHING AND LEVEL SHIFTING CIRCUIT

BACKGROUND OF THE INVENTION

This invention relates generally to pulse stretching and level shifting circuitry and, more particularly, to an integrated circuit for increasing the width of a transistor-transistor logic (TTL) input pulse and making the stretched pulse available at an output as a current mode logic (CML) compatible signal.

As is well known, it is often necessary to receive electrical signals which are compatible with a first type of circuitry and convert those signals so as to be compatible with a second type of circuitry. For example, it is often necessary to convert TTL signals into signals which are compatible with CMOS circuitry and visa-versa. Similarly, a need has arisen to convert standard TTL signal pulses so as to be compatible with CML components in bubble memory interface circuits. This has, in the past, been accomplished by utilizing the time constant of an off-chip circuit to produce the required stretching. Unfortunately, the use of off-chip components presents certain disadvantages. First, there is an overall increase in a number of components required. Second, circuit accuracy may be compromised by temperature drift. Third, the use of an external circuit requires the use of a pin on the pulse stretcher and level shifter chip. In a pin limited situation, the freeing of a pin may be extremely important.

SUMMARY OF THE INVENTION

It is an object of the present invention to provide an improved integrated circuit pulse stretcher and level shifter.

It is a further object of the present invention to provide an integrated circuit for stretching a TTL input pulse and producing a CML compatible output pulse, the circuit including a small on-chip capacitor which is charged by a very small charging current.

According to a broad aspect of the invention there is provided a pulse stretching integrated circuit, comprising: an on-chip capacitor having first and second terminals; first transistor means coupled to said first terminal for supplying a charging current to said capacitor and charging said capacitor to a first logical stage; differential transistor means having a first input coupled to said first terminal and a second input coupled to a reference voltage which is smaller than said first voltage, said differential transistor means for generating a first output when the voltage at said first terminal is less than said reference voltage and for generating a second output when the voltage at said first terminal is greater than said reference voltage; and second transistor means coupled to said first terminal for discharging said capacitor when said input signal pulses in a second logical state causing the voltage at said first terminal to fall below said reference voltage.

The above and other objects, features and advantages of the present invention will be more clearly understood from the following detailed description taken in conjunction with the accompanying drawings, in which:

DESCRIPTION OF THE PREFERRED EMBODIMENT

Figure 1:
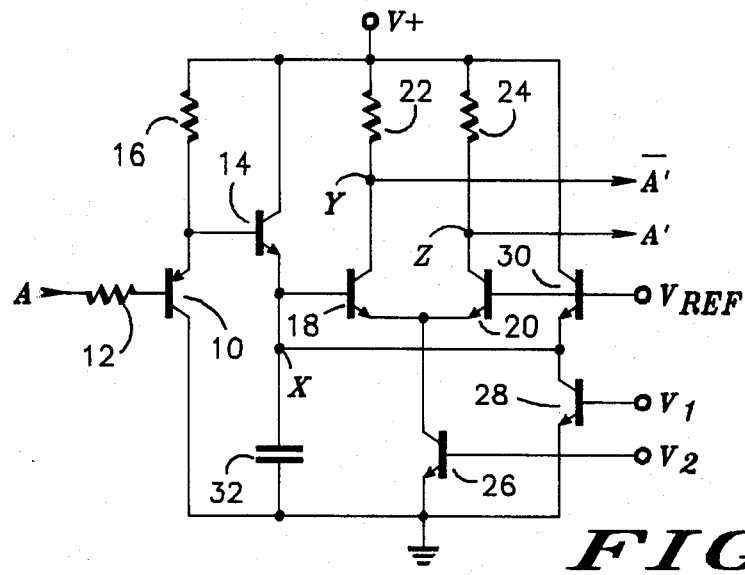
FIG. 1 is a schematic diagram of the inventive pulse stretcher and level shifting integrated circuit.

Referring to FIG. 1, an input PNP transistor 10 has a base coupled via resistor 12 to a source A of TTL pulses (i.e. having a logical zero level corresponding to approximately 0.4 volts, a logical 1 level corresponding to approximately 2.4 volts, and having a width of, for example, 200 nanoseconds). Input transistor 10 has a collector coupled to ground and an emitter coupled to the base of NPN transistor 14 and, via resistor 16, to a source of supply voltage V+ (for example 3.2 volts). Transistor 14 has the collector coupled to V+ and an emitter coupled to a node X.

A differential circuit includes emitter coupled NPN transistors 18 and 20 each of which have a collector coupled to nodes Y and Z respectively. A resistor 22 is coupled between node Y and V+, and resistor 24 is coupled between node Z and V+. The base of transistor 18 is coupled to node X, and the base of transistor 20 is coupled to a source of a reference voltage $V_{REF}$ (for example 1.2 volts). A small capacitor 32 (for example 20 picofarads) is coupled between node X and ground. A current sinking NPN transistor 26 has its collector coupled to the emitters of transistors 18 and 20, and emitter coupled to ground, and a base coupled to a second source of supply voltage $V_2$ which is chosen such as to keep transistor 26 operating in its active region.

NPN transistor 28 has a collector coupled to node X, an emitter coupled to ground and a base coupled to a third source of supply voltage which is chosen so as to cause transistor 28 to remain in its active region. Finally, transistor 30 has an emitter coupled to node X, a collector coupled to V+ and a base coupled to $V_{REF}$. The output of the circuit is taken across nodes Y and Z at which signals $\overline{A}'$ and $A'$ are generated.

Figure 2A:
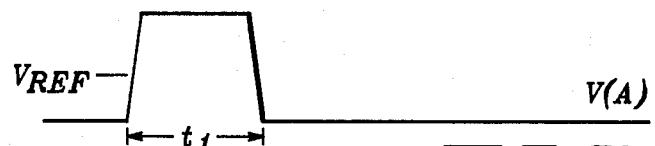
FIGS. 2A–2C are waveforms which aid in the understanding of the operation of the circuit shown in FIG. 1.

The circuit operates as follows. TTL pulses of the type shown in FIG. 2A are applied to the base of transistor 10 via resistor 12. Such pulses have a logical zero level of approximately 0.4 volts and a logical one level of approximately 2.4 volts. When A is low, transistor 10 is on, and base drive is diverted away from transistor 14 keeping transistor 14 off. Since transistor 28 is maintained on by $V_1$ thereby discharging any voltage stored in capacitor 32, $V_{REF}$ is greater than the voltage appearing at node X. Therefore, transistor 18 is off and transistor 20 is on. The voltage at node Y ($\overline{A}'$) is high (approximately 3.2 volts), and the voltage at node Z ($A'$) is low (for example 3.0 volts). Since transistor 26 is maintained on by $V_2$, transistor 26 sinks all current flowing through either transistor 18 or 20. Transistor 28 being on sinks current being sourced by transistor 30. Under the above conditions, the voltage at node X is $V_{REF}-V_{BE}$ when A is low where $V_{BE}$ is the base-emitter voltage of transistor 30.

When the TTL pulse at A goes high, transistor 10 turns off and transistor 14 turns on. Thus, the emitter of transistor 14 begins to source current. Since, however, transistor 28 cannot sink all the current being sourced by transistors 14 and 30, the voltage at node X will begin to increase causing transistor 18 to turn on and transistor 20 to turn off as soon as the voltage at node X exceeds $V_{REF}$. Also, when transistor 14 turns on, capacitor 32, since it is very small, is quickly charged. Under these conditions, the voltage at node Y ($\overline{A}'$) falls to approximately 3.0 volts while the voltage in node Z ($A'$)

rises to approximately 3.2 volts. At this point, the voltage at node X is greater than $V_{REF}$ and transistor 30 is effectively turned off (see FIG. 2B).

When the voltage at A again goes low, transistor 10 turns on, transistor 14 turns off and capacitor 32 begins to discharge through transistor 28. At some point during this discharge, the voltage at node X will fall below $V_{REF}$ at which point transistor 18 turns off, transistor 20 turns on, and the voltages as node Y ($\overline{A}'$) and node Z (A') again switch. Further, as the voltage at node X falls, transistor 30 will again start sourcing current to transistor 28.

Figure 2B:
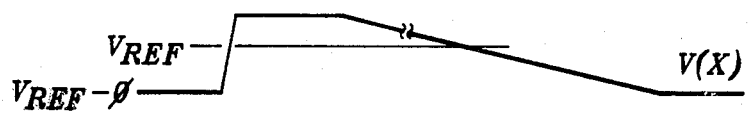

FIG. 2B illustrates the above described sequence of events at node X. As can be seen, when the TTL pulse shown in FIG. 2A goes low, the voltage at node X will gradually decrease to $V_{REF}-V_{BE}$.

Figure 2C:
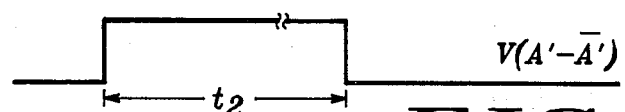

The circuit output is taken across node Y and Z and is a stretched pulse (shown in FIG. 2C) which has a low value of approximately 3 volts and high value of approximately 3.2 volts. While the width of the original TTL pulse ($t_1$) may be approximately 200 nanoseconds, the width of V(A'-$\overline{A}'$) ($t_2$) may exceed $t_1$ by, for example, one microsecond.

The voltage at node X will follow a logical zero to logical one transition at A quickly since capacitor 32 is charged by emitter follower 14. During a rapid logical one to logical zero transition at A, transistor 14 is off and the voltage at node X falls to $V_{REF}-V_{BE}$ at a rate which is determined by the value of capacitor 32 and the charging current at the collector of transistor 14.

The above description is given by way of example only. Changes in form and details may be made by one skilled in the art without departing from the scope of the invention as defined by the appended claims.

I claim:

1. A pulse stretching circuit, comprising:
   a capacitor having first and second terminals;
   first transistor means coupled to said first terminal for supplying a charging current to said capacitor and charging said capacitor to a first voltage when an input signal pulse is in a first logical state;
   differential transistor means having a first input coupled to said first terminal and a second input coupled to a reference voltage which is smaller than said first voltage, said differential transistor means for generating a first output when the voltage at said first terminal is less than said reference voltage and for generating a second output when the voltage at said first terminal is greater than said reference voltage; and
   second transistor means coupled to said first terminal for discharging said capacitor when said input signal pulse is in a second logical state causing the voltage at said first terminal to fall below said reference voltage;
   said first transistor means comprising a first transistor having an emitter coupled to a first source of supply voltage, a collector coupled to a second source of supply voltage and a base coupled to receive said input signal pulse; and a second transistor having a collector coupled to said first source of supply voltage, a base coupled to the emitter of said first transistor, and an emitter coupled to said first terminal and to said first input; and
   said second transistor means comprising a third transistor having a collector coupled to said first terminal, an emitter coupled to said second source of supply voltage, and base coupled to a third source of supply voltage which causes said third transistor to remain in its active region.

2. A circuit according to claim 1 further including anti-saturation means coupled to said reference voltage and to said second transistor means for preventing said second transistor means from becoming saturated.

3. A circuit according to claim 1 wherein said differential transistor means comprises:
   first and second emitter coupled transistors, said first emitter coupled transistor having a base coupled to said first terminal and a collector coupled to said first source of supply voltage and said second emitter coupled transistor having a base coupled to said reference voltage and a collector coupled to said first source of supply voltage; and
   a fourth transistor having an emitter coupled to said second source of supply voltage, a collector coupled to the emitters of said first and second emitter coupled transistors, and a base coupled to a fourth source of supply voltage which causes a fourth transistor to remain in its active region.

4. A circuit according to claim 3 wherein said anti-saturation means comprises a fifth transistor having a collector coupled to said first source of supply voltage, a base coupled to said reference voltage, and an emitter coupled to said second terminal and to the collector of said third transistor.

* * * * *